United States Patent [19]

Kellerman

[11] Patent Number: 4,865,875

[45] Date of Patent: Sep. 12, 1989

[54] MICRO-ELECTRONICS DEVICES AND METHODS OF MANUFACTURING SAME

[75] Inventor: David Kellerman, Littleton, Mass.

[73] Assignee: Digital Equipment Corporation, Maynard, Mass.

[21] Appl. No.: 170,914

[22] Filed: Mar. 21, 1988

Related U.S. Application Data

[62] Division of Ser. No. 834,912, Feb. 28, 1986, Pat. No. 4,781,968.

[51] Int. Cl.⁴ ............................................. B05D 5/12
[52] U.S. Cl. ..................................... 427/96; 156/89; 428/901
[58] Field of Search .................. 428/209, 313.3, 314.2, 428/315.5, 426, 315.9, 432, 901; 174/68.5; 427/96, 180, 212; 156/89; 361/397

[56] References Cited

U.S. PATENT DOCUMENTS

| | | |
|---|---|---|
| 4,134,848 | 1/1979 | Adicoff et al. ............... 523/219 |
| 4,238,641 | 12/1980 | Planting et al. .............. 523/444 |
| 4,382,821 | 5/1983 | Davis et al. .................. 523/173 |
| 4,403,107 | 9/1983 | Hoffman ...................... 428/313.3 |
| 4,426,320 | 1/1984 | Davis et al. .................. 523/173 |

OTHER PUBLICATIONS

Low Dielectric Constant Material for Printed Circ. Bds., IBM Tech. Discl. Bull., vol. 22, No. 5 (Oct. 1979), Haining et al, p. 1799.

Primary Examiner—Ellis P. Robinson
Assistant Examiner—P. J. Ryan
Attorney, Agent, or Firm—Hayes, Soloway, Hennessey & Hage

[57] ABSTRACT

A low dielectric constant material for use in the formation of thick film circuits such as VLSI devices. The material comprises a thick film insulation matrix of standard viscosity; a thick film organic vehicle; and a plurality of dry, hollow, glass microspheres. The insulation matrix, vehicle, and microspheres are thoroughly combined into a homogeneous material of standard viscosity.

7 Claims, 3 Drawing Sheets

MICRO-ELECTRONICS DEVICES AND METHODS OF MANUFACTURING SAME

This is a division of co-pending application Ser. No. 834,912, filed Feb. 28, 1986, now U.S. Pat. No. 4,781,968.

BACKGROUND OF THE INVENTION

The present invention relates to micro-electronics devices and methods of manufacturing same, and more particularly to improvements in low dielectric constant materials for use in the formation of micro-electronics devices. The invention has particular utility for the manufacture of integrated circuits of the so-called "thick film" type and will be described in connection with such utility although other uses are contemplated.

In manufacturing very large scale integrated (VLSI) devices according to thick film procedures, alternating layers of electrically conductive and electrically insulative materials typically are disposed on a rigid support substrate formed of an insulative material in a process much like the traditional silk screening process used in the graphics arts industry.

In the standard thick film process for producing VLSI devices the first step in the process is to screen print a so-called "ink" onto a rigid dielectric base or substrate board, air dry the ink, and fire the ink to form a first metal pattern on the substrate board. Typically, the substrate board comprises glass, porcelain-coated metal or a ceramic such as alumina or beryllia, and the ink comprises a relatively high viscosity mixture of electrically conductive metals such as silver, gold or copper or metal alloys such as gold-palladium, or silver-palladium and a vitreous binder suspended in an organic vehicle or thinner. The screen printing typically is performed through a silk or fine stainless-steel mesh screen that has been previously patterned in the desired pattern of the metal layer or circuit. The screen is placed over the substrate and a squeegee is used to force the screen down to the substrate and, simultaneously, force the ink through the patterned mesh of the screen and down onto the surface of the substrate. The patterned substrate is then air dried to evaporate off at least a portion of the organic vehicle, and the patterned, dried substrate then is fired in an oven to bond the electrically conductive metals to the substrate. A coating or layer of dielectric/insulating material, typically a glass ceramic in a vitreous binder and organic vehicle is then applied over the fired metal pattern, the insulating material is air dried to evaporate at least a portion of th organic vehicle, and the dried coating is then fired in a furnace or kiln as before to bond the insulation coating to the metal-patterned substrate. Alternatively, the conductive patterns and dielectric/insulating layer may be co-fired. The process is repeated with alternating patterned metal layers and dielectric layers until the desired number of layers are completed. By providing passageways in the insulating layers (referred to as "vias"), conductive paths can be created therethrough interconnecting the metal conducting layered patterns enabling a three dimensional interconnected pattern to be fabricated. The vias for layer to layer interconnection may be formed as part of the layering process. Alternatively, the vias may be formed by using a laser to create overlapping holes in the dielectric insulating layers which then may be back filled with metal to create the conductive interconnections between layers. In this manner, structures of ten and more metal layered patterns have been fabricated for high reliability hybrid microcircuit devices.

The dielectric properties of the insulating layers are a limiting factor in the size and performance characteristics of the VLSI circuit. For example, where there is overlap between metal on adjacent layers, there is a capacitance created. Thus, higher frequencies occurring at higher circuit operating speeds and the like, may cause capacititive coupling (slowing the signal or causing cross talk), between the layers at these points by this unavoidable capacitance. The presently employed dielectric materials for forming the insulating layers generally comprise glass ceramics and ceramic/glass composites. Glass ceramics are glasses which are devitrified by heating to form a very fine network of crystalline phase material. Glass ceramics are mechanically strong and have relatively low thermal expansion coefficients which makes them particularly suited for VLSI chip attachment and thick film device processing techniques as above described. However, commercially available glass ceramics and composites have a dielectric constant in the range of 9 to 12, and an electrical insulation resistance of about $10^{12}$ Ohms and higher at room temperature and 300 volts. Due to their electrical properties and process constraints, line/space sizing of circuits on thick film devices made using glass ceramic dielectrics generally is about 0.007/0.007 inches minimum, via sizes generally are about 0.010 inches minimum width, and the thickness of the dielectric material to attain satisfactory performance generally is about 0.0015 inches minimum.

Accordingly, if a material having a lower dielectric constant could be employed for forming the insulating layers in VLSI circuits, the useful frequency range before interlayer-capacitance becomes a problem can be increased and propagation delay decreased.

Wherefore, it is the object of the present invention to overcome the aforesaid and other disadvantages of the prior art. A more specific object is to provide an improved thick film process characterized by the use of a new and improved low dielectric constant insulative material. Still other objects and many of the attendant advantages of the invention will become clear from the following description.

SUMMARY

Generally, in accordance with the present invention, a multilayer thick film device is formed in which the insulating layers comprise fired-in-situ hollow glass microspheres, preferably of a size not exceeding about 400 mesh (U.S. Standard Sieve Series). More particularly, in accordance with the present invention, starting with a rigid insulative substrate such as ceramic, the first layer of metallic pattern or patterns is formed on the surface of the ceramic substrate by conventional means such as by screen-printing a metallization pattern using a conventional thick-film ink comprising a matrix of conductive metallic particles and a vitreous binder suspended in a conventional organic carrier. The screen-printed material then is air dried to evaporate the carrier at least in part, and the resulting structure then is fired at high temperature to fuse the metallization pattern into a continuous conductor or conductors rigidly affixed to the ceramic substrate. An overlay of dielectric insulating material comprising a conventional glass ceramic or ceramic/glass composite matrix material (hereafter referred to as the matrix material), and containing hollow glass microspheres in accordance with the present invention and as will be described in detail hereafter, and disposed in a conventional thick film organic carrier vehicle, then is applied to the resulting structure, the insulating dielectric overlay material is air dried and fired in place at a high temperature. Alternatively, the screen-printed material and the overlay of insulating dielectric material may be co-fired at high temperature.

Firing of the screen-printed material causes the conductive particles of the metallization pattern to be sintered and fused into a continuous conductor or conductors in the shape of the desired pattern. Firing also evaporates any residual carrier, and fuses the vitreous material around the hollow glass microspheres to form a rigid pancake-like structure with the hollow glass microspheres imbedded therein. Preferably a second layer of insulating dielectric material comprising a conventional glass ceramic or ceramic/glass composite matrix material, and contianing hollow glass microspheres, suspended in an organic carrier as before, is then squeegeed onto the structure to fill any pinholes that may have formed in the first insulating layer. And, if further desired, in a preferred embodiment of the invention, a third layer of dielecric material comprising a conventional glass/ceramic dielectric in an organic binder may be applied, dried and fired so as to level or planerize the dielectric top surface.

The aforesaid screen-printing and firing procedures may then be repeated to establish as many layers of circuits as may be desired, typically 8-10 screen-printed circuit metal layers are formed, separated by dielectric layers above-described.

Thus, using the insulating dielectric material of the present invention in the preferred manner, three layers of material preferably are deposited between each metal pattern layer. The overall preferred process comprises the steps of:

(a) forming a low dielectric material by blending a conventional thick film insulation matrix material, a conventional organic carrier vehicle and a plurality of dry hollow glass microspheres into a homogeneous material;

(b) depositing the dielectric material blend from step (a) onto the preferred circuit, and drying and firing the deposited blend;

(c) depositing a second layer of dielectric material from step (a) onto the resulting structure, and drying and firing the deposited blend; and (d) depositing a conventional (unmodified) thick film insulation material comprising a standard glass/ceramic in a conventional organic carrier vehicle onto the resulting structure, and drying and firing the deposited material.

DESCRIPTION OF THE DRAWINGS

For a further understanding of the nature and objects of the present invention, reference should be had to the following detailed description taken in connection with the accompanying drawings wherein like numbers depict like parts, and wherein.

DESCRIPTION OF THE PREFERRED EMBODIMENT

Figure 1:
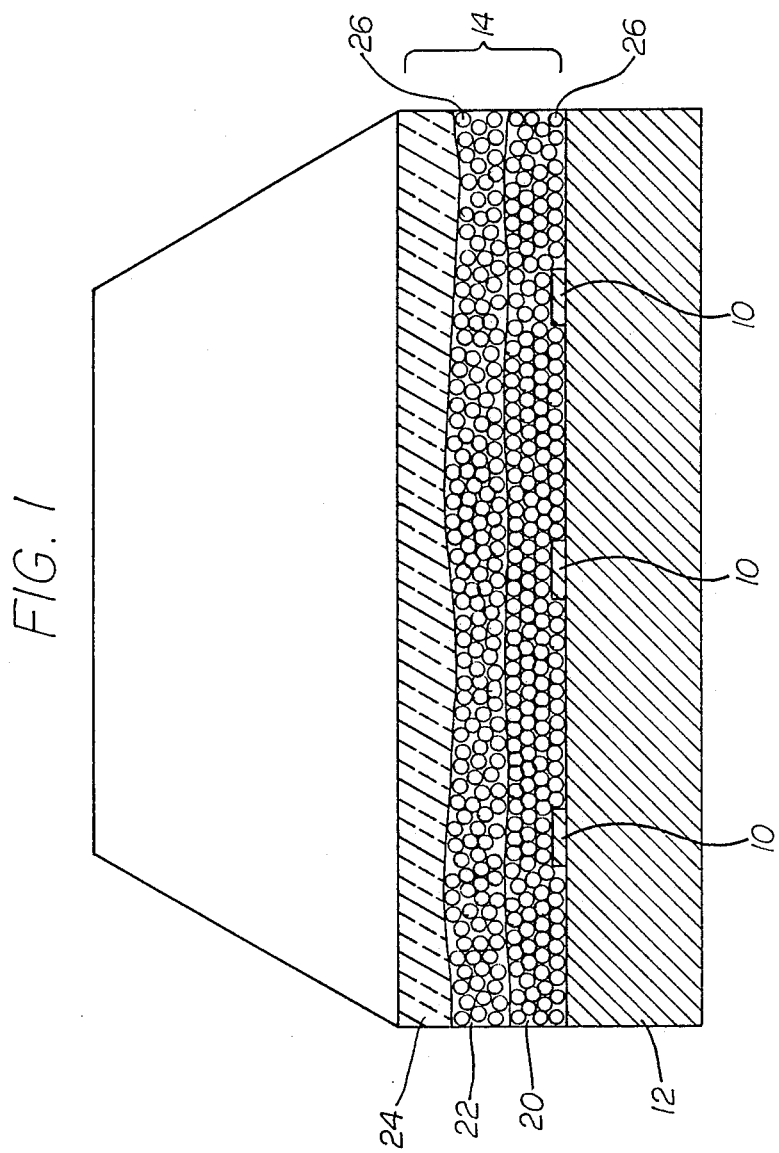
FIG. 1 is a simplified drawing of a cutaway segment of a thick film VLSI device made in accordance with the present invention.

A portion of thick film VLSI device made according to the present invention is shown in FIG. 1. The substrate 12 and metal pattern 10 are as previously described and are produced in the manner as above described. In the embodiments described hereinafter, the substrate 12 comprises a conventional substrate material such as Alumina, and the metal patterns comprising a sintered or fired gold ink. The dielectric layer 14 preferably is comprised of three layers 20, 22 and 24 where the first two layers 20, 22 each contain hollow glass microspheres 26 (shown in exaggerated size) in accordance with the present invention and the top or sealing layer 24 comprises standard thick film insulation material.

A key feature of the present invention is the incorporation of hollow glass microspheres in the thick film dielectric layer(s). Hollow glass microspheres are available commercially from a number of vendors. The presently preferred hollow glass microspheres comprise hollow silica microspheres available from Emerson and Cumming, Inc, Canton, Massachusetts, under the trademark Eccospheres. The manufacturer describes this material as comprising hollow silica microspheres of average size 12 to 40 microns, and having average wall size of 0.5 to 2.0 microns. In order to assure maximum performance, the glass microspheres preferably comprise a mixture of different size glass microspheres, dry-screened to about 400 mesh (U.S. Standard Sieve Series). It has been found that the use of a mixture of different size glass microspheres produces a product of more uniform filling and maximum packing, while the inclusion of appreciable quantities of microspheres in excess of about 400 mesh causes unacceptable dielectric film disruption of the resulting insulation layer(s) made using the materials in accordance with the present invention. The use of hollow glass microspheres 20 to 200 microns in diameter and having wall thickness of 0.5 to 2 microns as fillers for lowering the dielectric constant of the epoxy laminating board resins for printed circuit boards is disclosed in IBM Technical Disclosure Bulletin Volume 22, Number 5, October 1979. However, there is no disclosure or suggestion in the aforesaid IBM Technical Disclosure Bulletin that such hollow glass microspheres may be subjected to the high temperature multiple firing conditions encountered in thick film processes so as to be useful in the manufacture of thick film devices, or of the advantages as will result from such use as in accordance with the present invention.

The dry-screened hollow glass microspheres are blended with a conventional thick film glass ceramic matrix material and organic vehicle. In general, the thick film glass ceramic matrix material comprises a conventional glass/ceramic powder in an organic vehicle. A particularly preferred vehicle comprises DP8250 available from E.I. DuPont de Nemours, Wilmington, Delaware. Alternatively, semiconductor grade terpineol may be used as the vehicle.

The following blending procedure has been established in order to assure a substantial uniform blend of the hollow glass microspheres in the thick film matrix and organic vehicle. First, the follow glass microshperes are dry-screened to about 400 mesh, and the screened hollow glass microspheres are added to the thick film organic vehicle and blended. In order to assure against possible introduction of metal fines, etc., into the blend, the hollow glass microspheres and vehicle should be blended in a glass lined or plastic lined containers. The overall procedure is to first spatula stir followed by high speed jar rolling utilizing a conventional ball mill drive. In order to maintain the integrity of the hollow glass microspheres, no medium should be added to the jar which could possibly grind the microspheres. The resulting blend is then added to a conventional glass/ceramic thick film matrix in a carrier, and the resulting mixture high speed jar rolled as before.

While not wishing to be bound by theory it is believed that the unexpected substantial reduction in the dielectric constant of the insulation material made in accordance with the present invention results from the large volume of air ($E_r=1$) entrapped in the microspheres and thus in the insulating layers. The inclusion of even small quantities of hollow glass microspheres to an insulating layer will have some effect on reducing the dielectric constant of the resulting insulating layer. However, it has been observed that insulating layers made using hollow glass microspheres in accordance with the present invention and having in excess of about 10-15% by volume of the hollow glass microspheres exhibit appreciably reduced dielectric constants as compared to conventional glass ceramic and ceramic/glass composite insulating layers. On the otherhand, inclusion of hollow glass microspheres in amounts in excess of about 45-50 volume percent drastically adversely affects the structural strength and thermal resistance of the resulting insulating layers. Particularly useful compositions in accordance with the present invention comprise about 20% to about 42% by volume of the hollow glass microspheres, and preferably comprise from about 35% to about 39% by volume of the hollow microspheres.

The present invention will now be further described in connection with a preferred embodiment of the present invention.

To create the low dielectric material of the present invention, five parts by weight of pre-sifted 400 mesh dry, hollow, silica microspheres (Silica Fccospheres TM, available from Emerson and Cummings, Inc.) are added to thirteen parts by weight of DP8250 standard thick film organic vehicle available from DuPont. The organic vehicle is used as it is supplied by the manufacturer. This mixture is then first spatula stirred and then high speed jar rolled on a ball mill for 10 minutes to thoroughly mix the hollow glass microspheres with the carrier vehicle.

To thirty parts by weight of Englehard Zero Flow TM standard thick film glass/ceramic composite matrix material is then added ten parts by weight of the resulting hollow glass microsphere/organic vehicle blend and the resultant mixture is high speed jar rolled for 15 minutes to provide a thoroughly mixed homogeneous mixture.

The resultant mixture is the low dielectric material to be used according to the present invention and is of standard viscosity.

Figure 2:
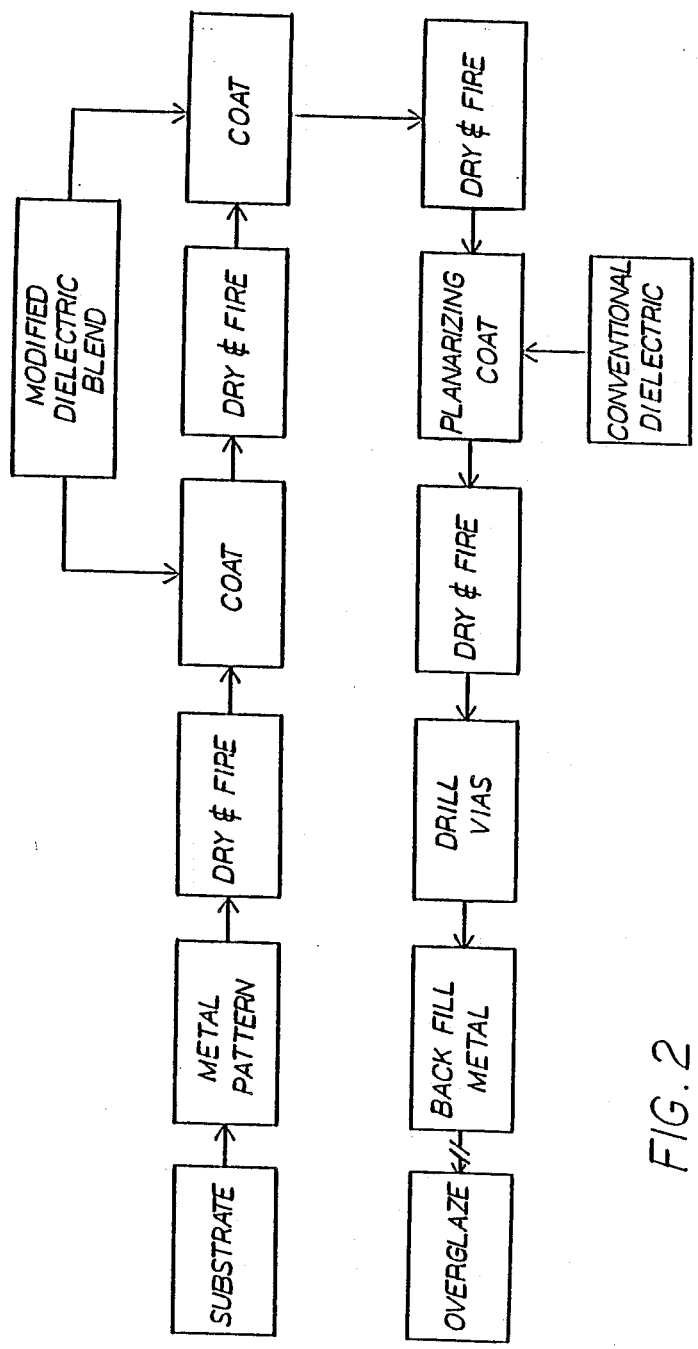
FIG. 2 is a block diagram diagrammatically illustrating one process for producing a thick film VLSI device in accordance with the teachings of the present invention.

Returning now to FIG. 2, the formation process according to the preferred embodiment of the present invention will now be discussed in greater detail.

The metal pattern 10 is first printed on the substrate 12, dried and fired. The first layer 20 of the low dielectric material of the present invention produced as above described is then applied over the resulting structure utilizing a metal stencil screen, 0.005 inches thick. Layer 20 is then dried and fired yielding a first dielectric layer 20 of thickness in the range of 0.0015 to 0.0030 inches. A second layer 22 of low dielectric material of the present invention produced as above described then is squeegeed over the resulting structure in an identical fashion and layer 22 is then dried and fired as before. Layer 22 fills any pinholes left in layer 20 and helps to planarize the structure. The thickness of layer 22 upon firing will typically be in the range of 0.0010 to 0.0020 inches. Thereafter, in order further to planarize the structure and to prepare the structure for additional metal circuit layers, a layer 24 of a conventional thick film glass/ceramic material (Englehard Zero Flow TM available from Englhard Corporation, Newark, New Jersey) in an organic vehicle is cast onto the resulting structure. Layer 24 is then dried and fired in a conventional manner. Typically, layer 24 will be approximately 0.5 mils thick. Layer 24 provides a further dielectric substrate while, at the same time, provides an optimum planar substrate for the next layer of metal circuit to be printed on top of it.

Thereafter, vias are formed through the insulating layers using a laser or the like to create overlapping holes in the dielectric layers, and the holes are then back filled with liquid metal to create the desired conductive interconnections between the layers.

Figure 3:
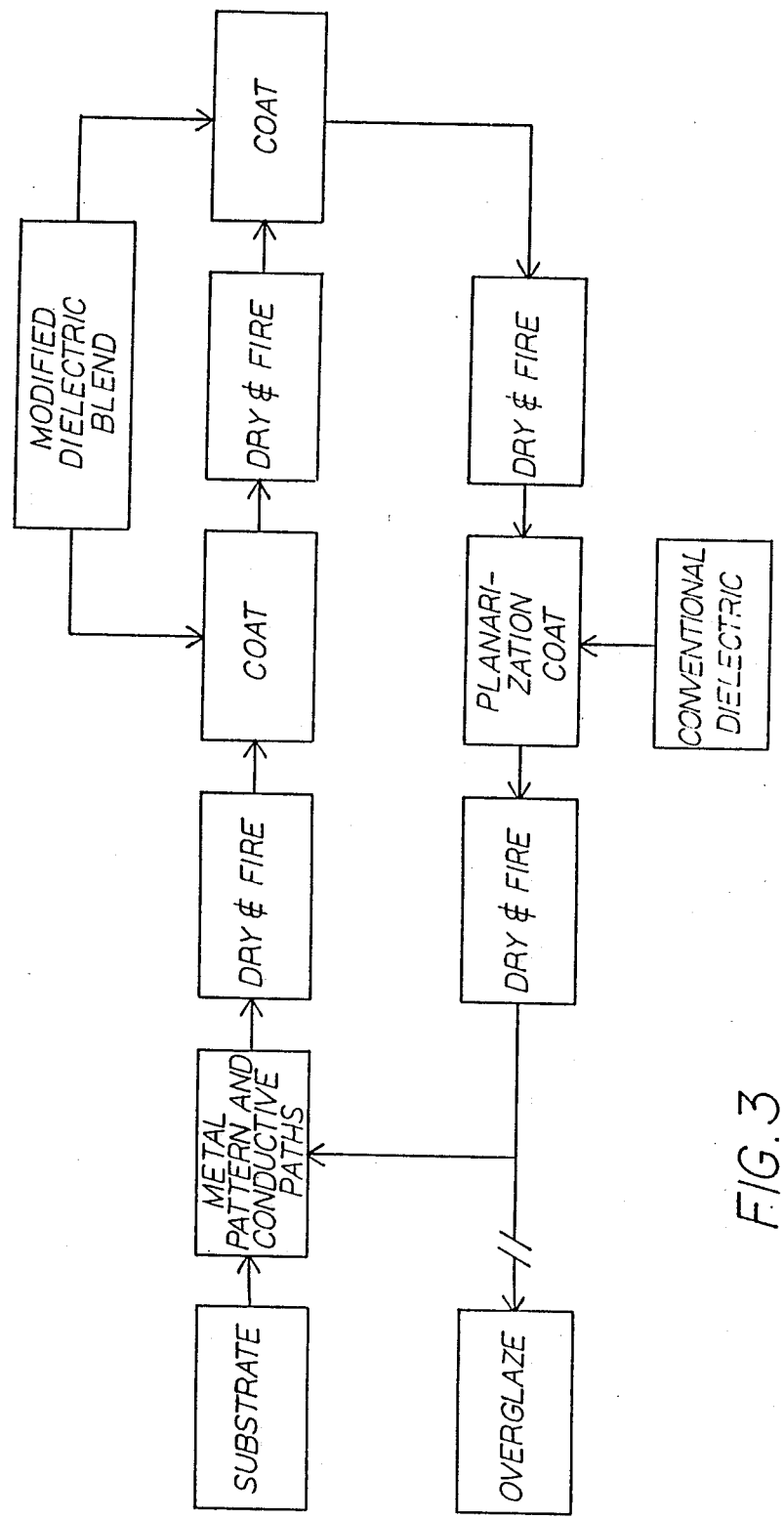
FIG. 3 is a block diagram diagrammatically illustrating an alternave process for producing a thick film VLSI device in accordance with the teachings of the present invention.

Alternatively, as shown in FIG. 3, the conductive paths between layers may be produced simultaneously with metallic pattern formation using methods well known in the art.

The aforesaid steps them may be repeated with alternating pattern metal layers and insulating layers as before being formed until the desired number of circuit layers are completed.

Finally, the resulting microcircuit may be overglazed in a conventional manner with a conventional vitreous glass glazing material so as to seal the circuit from the environment.

As will be seen from the foregoing, the present invention provides an improved thick film manufacturing method and thick film devices having improved performance characteristics as compared with the prior art.

The process and material of the present invention provides a dielectric/insulating material which in VLSI devices exhibits a dielectric constant of approximately 3.5 with some copper systems, and 4.0-4.5 with most gold thick film systems. This is a significant advantage over the lowest known prior art dielectric/insulation materials currently available which are believed to provide a dielectric constant of about 7 with copper systems. Moreover, in addition to its low dielectric constant, the dielectric material of the present invention has the benefit of being compatible with both gold, gold alloy and copper metallurgies. It is particularly suitable for high density, high temperature, high speed applications. In tests conducted the response of line impedance over frequencies from 3 to 26 GHz was generally flat. Similarly, data from 1 KHz to 13 MHz demonstrated flat response as well.

Various changes may be made in the above process and device without departing from the scope of the invention herein described. It is therefore intended that all matter contained in the above description shall be interpreted in an illustrative and not in a limiting sense.

Wherefore, having thus described my invention, I claim:

1. A method of forming a low dielectric constant insulation layer according to thick film procedures comprising the steps of:
   (a) combining a thick film insulation matrix material comprising ceramic or glass ceramic composite, a thick film organic vehicle, and a plurality of hollow glass microspheres having a maximum size not exceeding about 400 mesh (U.S. Standard Sieve Series) into a homogeneous material;
   (b) depositing the material from step (a) onto the circuit portion to a desired thickness for the insulation layer; and
   (c) drying and firing the deposited material from step (b) to provide a material having a dielectric constant less than about 4.5 said firing causing the conductive particles of the metallization pattern to be sintered and fired into a continuous conductor in the shape of the desired pattern, said firing also evaporating any residual carrier and fusing the said material around the hollow glass microspheres to form a rigid structure with the hollow glass microspheres embedded therein.

2. The method of claim 1 and including the step of screening said hollow glass microspheres through a 400 mesh screen (U.S. Standard Sieve Series) prior to said combining.

3. A method of producing a low dielectric constant insulation layer according to thick film procedures comprising the steps of:
   (a) combining a thick film insulation matrix material comprising ceramic or glass ceramic composite, a thick film organic vehicle, and a plurality of hollow glass microspheres having a maximum size not exceeding about 400 mesh (U.S. Standard Sieve Series);
   (b) depositing the material from step (a) onto the metal pattern to a desired thickness;
   (c) drying and firing the low dielectric constant material deposited in step (b) to provide a material having a dielectric constant less than about 4.5 said firing causing the conductive particles of the metallization pattern to be sintered and fired into a continuous conductor in the shape of the desired pattern, said firing also evaporating any residual carrier and fusing the said material around the hollow glass microspheres to form a rigid structure with the hollow glass microspheres embedded therein;
   (d) repeating steps (b) and (c) until the final desired thickness of the insulation layer is approached;
   (e) depositing a conventional thick film dielectric insulating material onto the structure resulting from step (d) to a desired thickness to planarize the resulting structure; and,
   (f) drying and firing the material from step (e).

4. A method of producing a thick film device according to thick film procedures comprising the steps of:
   (a) providing a rigid dielectric substrate;
   (b) depositing a predetermined metal pattern on said substrate;
   (c) providing a low dielectric constant material which comprises a substantially homogeneous blend of a thick film insulation matrix material comprising ceramic or glass ceramic composite, a thick film organic vehicle and a plurality of hollow glass microspheres having a maximum size not exceeding about 400 mesh (U.S. Standard Sieve Series);
   (d) depositing the material from step (c) onto the deposited metal pattern;
   (e) drying and firing the material deposited in step (d) to provide a material having a dielectric constant less than about 4.5 said firing causing the conductive particles of the metallization pattern to be sintered and fired into a continuous conductor in the shape of the desired pattern, said firing also evaporating any residual carrier and fusing the said material around the hollow glass microspheres to form a rigid structure with the hollow glass microspheres embedded therein; and
   (f) repeating steps (b) to (e) until the desired number of metal patterns separated by layers of low dielectric material are completed.

5. A method according to claim 4, wherein said metal pattern is deposited as a firable ink, and including the step of drying and firing the ink.

6. A method according to claim 5, wherein said ink and said low dielectric constant material are co-fired.

7. A method according to claim 4, and including the step of depositing a conventional thick film dielectric insulating material onto the structure resulting from step (e) to planarize the resulting structure.

* * * * *